United States Patent [19]

Wheeler et al.

[11] Patent Number: 4,609,037
[45] Date of Patent: Sep. 2, 1986

[54] APPARATUS FOR HEATING AND COOLING ARTICLES

[75] Inventors: William R. Wheeler, Saratoga; Steven R. Lee, Mountain View, both of Calif.

[73] Assignee: Tencor Instruments, Mountain View, Calif.

[21] Appl. No.: 786,231

[22] Filed: Oct. 9, 1985

[51] Int. Cl.⁴ .................. F25B 29/00; F28F 7/00; F28D 11/00
[52] U.S. Cl. ...................... 165/61; 165/80.5; 165/86; 432/120
[58] Field of Search .............. 432/120, 222, 231; 219/343; 165/61, 80.5, 86

[56] References Cited

U.S. PATENT DOCUMENTS 4,097,226  1/1978  Erikson et al. ................. 432/120
4,527,620  7/1985  Pedersen et al. ................ 165/86

OTHER PUBLICATIONS

Nicollian and Brews, *MOS Physics and Technology* (1982), p. 625.
Signatone Corporaton, Model S-1040.
Temptronic Corp., Model TP36 ThermoChuck System.
Wentworth Laboratories, TC-100 Tempchuck.
Micromanipulator Company, Inc., C-V Systems.

*Primary Examiner*—John J. Camby
*Attorney, Agent, or Firm*—Thomas Schneck

[57] ABSTRACT

A first thermally conductive plate holds an article and heats the article with heating elements in the plate. Parallel rails support the first plate above a base. Cooling passageways for coolant flow are in a second thermally conductive plate. The second plate is supported spaced from the base by a shaft in a chamber of the second plate and a spring. During the heating phase, the second plate is spaced apart from the first plate. During the cooling phase, the second plate is urged by the spring into contact with the first plate, so that the second plate acts as a heat sink for the first plate. Vacuum suction and an annular elastomer seal around the top rim of the second plate clamp the first and second plates together in thermal communication. Vacuum suction in the chamber retracts the second plate from the first plate.

8 Claims, 4 Drawing Figures

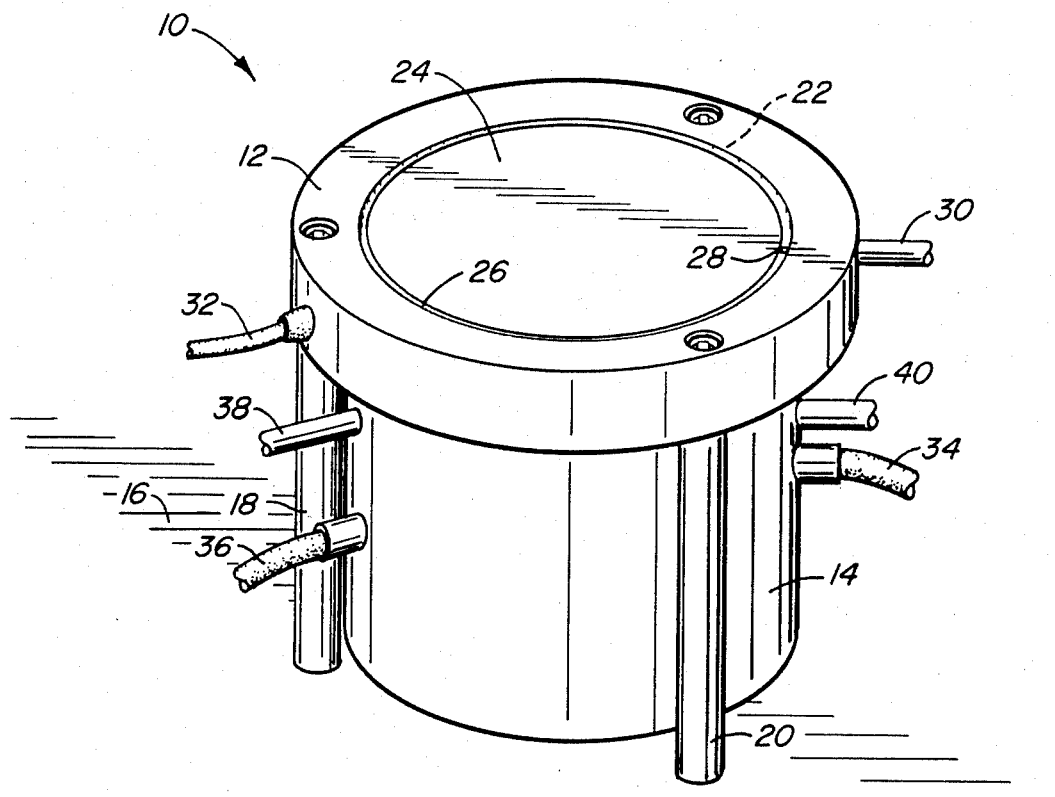
FIG._1.
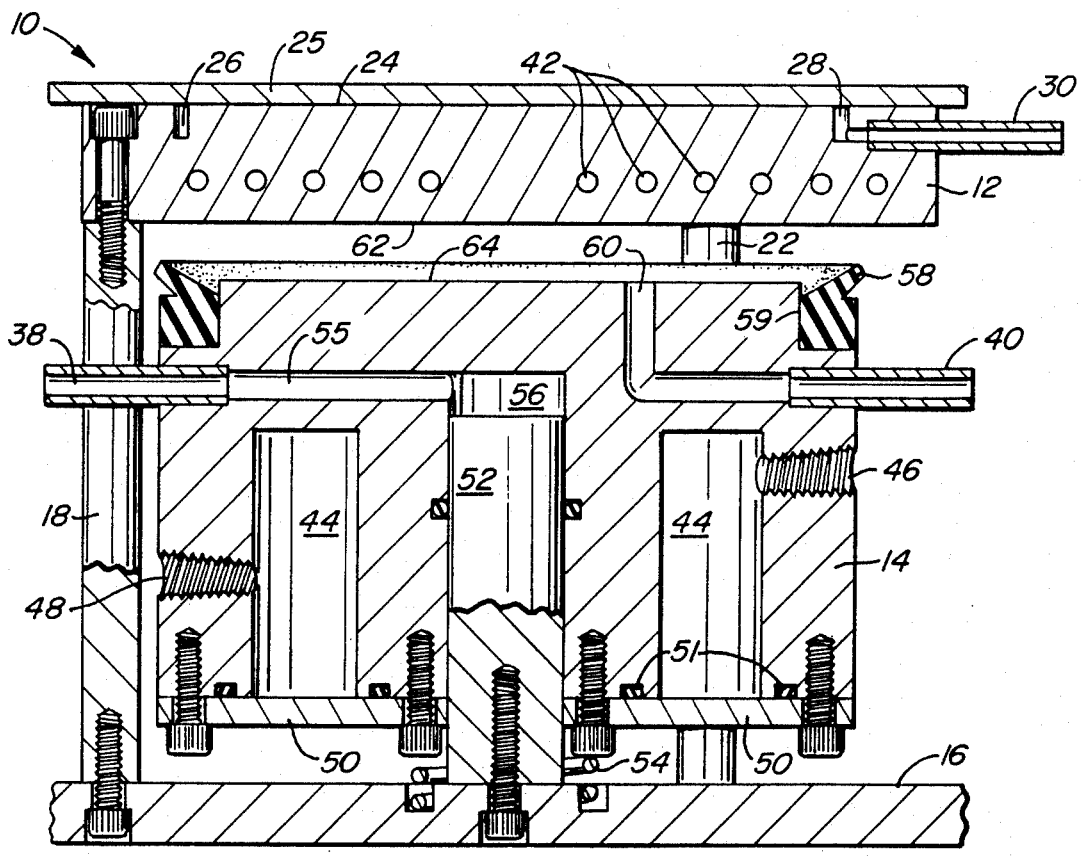
FIG._2.

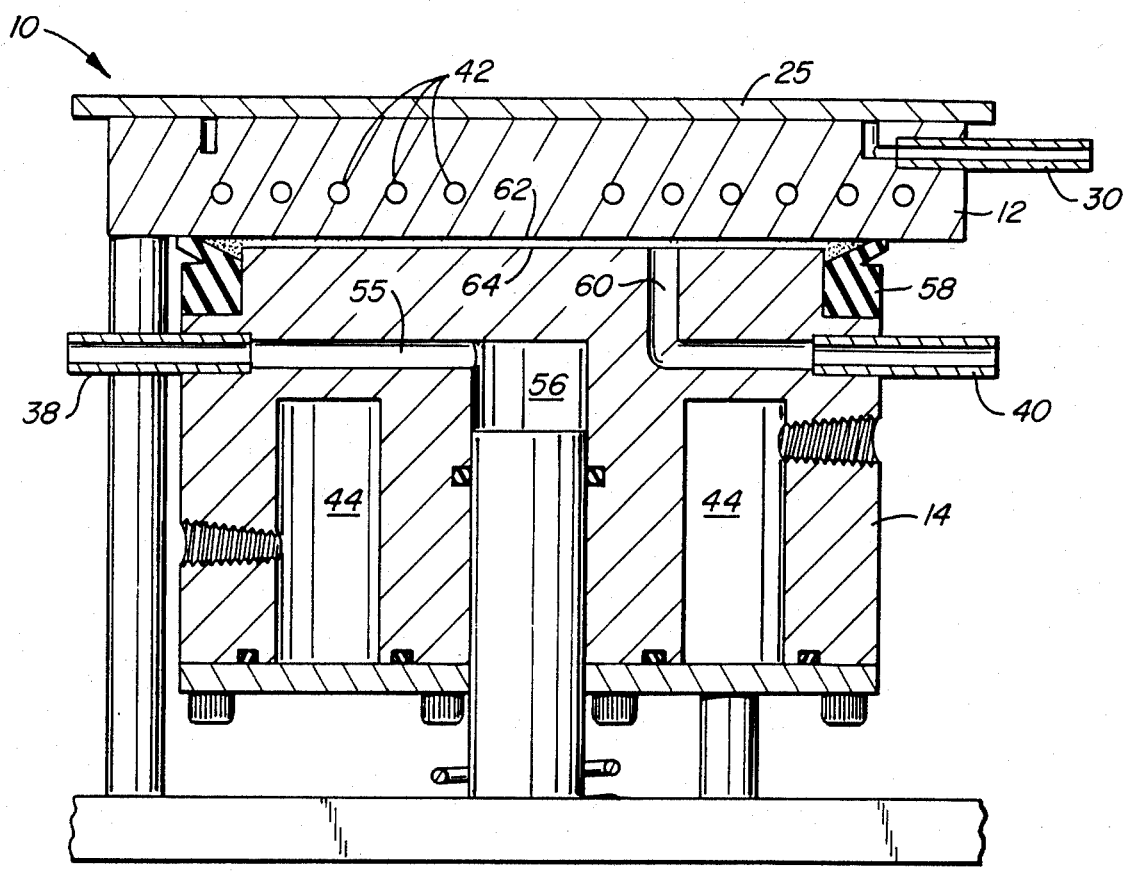
FIG._3
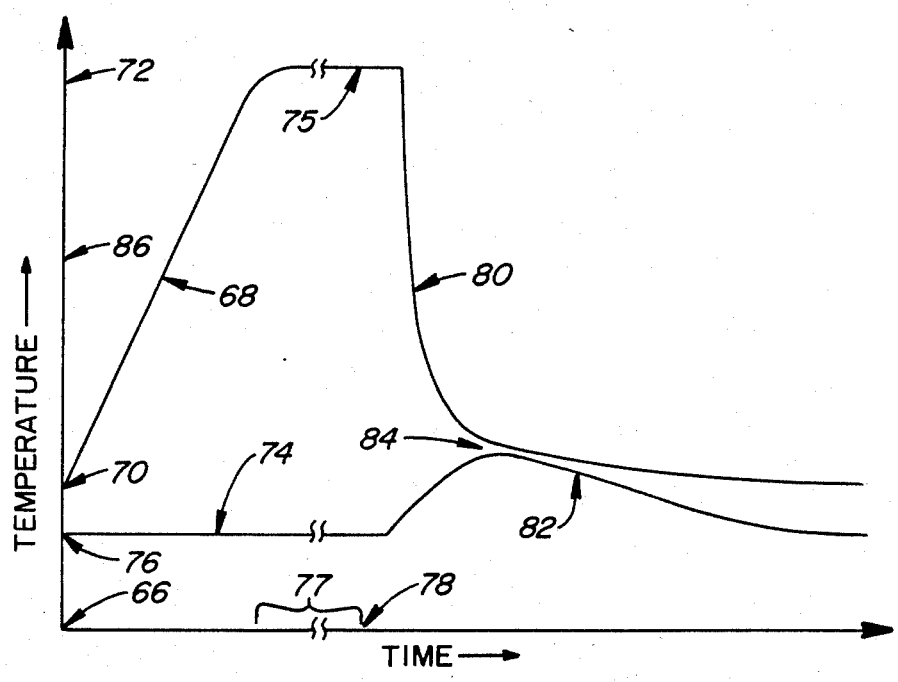
FIG._4.

APPARATUS FOR HEATING AND COOLING ARTICLES

TECHNICAL FIELD

The present invention relates to apparatus for conductive heating and cooling of articles.

BACKGROUND ART

A common, variable temperature, conductive heating apparatus for semiconductor wafers, known as a thermal wafer chuck, is shown on p. 625 of Nicollian and Brews' MOS Physics and Technology, published in 1982. The chuck is a thermally conductive brass block through which heater elements are placed. The block is spaced above a floor by thermally insulative ceramic spacers to confine heat to the block. Wafers to be tested are held to the block by a vacuum. Grooves on the top surface of the block distribute the vacuum underneath the wafer, making the pressure on the wafer against the block more uniform. Copper tubing is brazed underneath the block through which a coolant such as tap water flows to quickly cool the block back to room temperature after heating.

Other wafer chucks also use water or other fluid flow for cooling. One type of commercial hot chuck passes a coolant, usually tap water, through a cooling coil which is thermally connected to the underside of the chuck. Similarly, another commercially available device uses flexible tubing attached to the chuck and connected to a tap water supply. Alternately, another commercial device has the chuck equipped with coolant passages. Tap water, chilled bottled gas or shop gas can be connected to the chuck to provide rapid cool-down.

One problem with prior art wafer chucks is that coolant flows only during the cooling phase. During the heating phase, the coolant remains stationary in the coils, tubing or passageways so as not to cool the chuck. Some coolant remains in contact with the block. The thermal mass of the cooling structure soaks up heat, increasing thermal load and slowing down the heating process. Further, this coolant is heated during the heating phase, reducing the temperature differential between the coolant and the block so that during the cooling phase, cooling is slowed until cooler water reaches the cooling tubes.

Additionally, during the heating phase, thermal wafer chucks can reach peak temperatures of 300° C. to 400° C., which is well above the boiling point of water. Steam may be generated in the cooling tubes. Eventually, the coils, tubes or passageways corrode and leak. If tap water is used, minerals may be deposited in the tubes, further decreasing their lifetime. In the case where the chuck has coolant passageways, the entire chuck will eventually need to be replaced.

An object of the invention is to produce a variable temperature, conductive heating and cooling apparatus having faster heating and cooling.

DISCLOSURE OF THE INVENTION

The above object has been met with a variable temperature apparatus resembling a hot plate, which separates a heating function within a first plate of low heat capacity, from a cooling function in a second plate or block of large heat capacity, movable into thermal contact with the first plate. A first thermally conductive plate, a chuck, holds a wafer or disk in tight contact by a vacuum and is heated by heating elements therein. During the chuck's heating phase, a second plate or block is spaced apart from the first plate. The block, cooled by fluid passages therein, is mounted on a shaft which guides the block into good thermal contact with the first plate during a cooling phase. The block becomes a heat sink for the first plate. Coolant, such as water, flows through the cooling passageways of the block, removing heat from the block by conduction to maintain the temperature of the block.

A base has parallel posts or rails extending outwardly therefrom, the ends of which support one of the plates, usually the first plate, above the base. The other plate is supported by a shaft and compression spring connected to the base. The second plate is urged into contact with the first plate by the spring and by a vacuum introduced between the first and second plates. An annular elastomer seal maintains vacuum clamping of the first and second plates. A vacuum applied between the block and the shaft retracts the block from contact with the first plate.

An advantage of the separation of the heating and cooling functions into two plates is that cooling structure is not in contact with the first plate during the heating phase, so heating of the first plate is more rapid. A massive second plate, at the coolant temperature cools the low mass first plate rapidly. Also, the coolant is not heated during the heating phase, so that during the cooling phase cooling of the first plate is more rapid. Finally, the coolant never reaches the boiling point, so the problems of steam generation are avoided.

BRIEF DESCRIPTION OF THE DRAWINGS

FIG. 1 is a perspective view of the apparatus of the present invention.

FIG. 2 is a side sectional view of the apparatus of FIG. 1 during a heating phase.

FIG. 3 is a side sectional view of the apparatus of FIG. 1 during a cooling phase.

FIG. 4 is a graph of the temperatures of the apparatus in FIG. 1 versus time.

BEST MODE FOR CARRYING OUT THE INVENTION

With reference to FIG. 1, an apparatus for heating and cooling 10 has a first plate or chuck 12 and a second plate or block 14. Plate 12 and block 14 are made of thermally conductive material such as brass or aluminum. As an example, this description mentions semiconductor wafers as the articles to be heated and cooled. Such heating and cooling might be necessary during electrical testing. Other articles, such as magnetic disk substrates, glass, building materials and the like might need controlled temperature testing and could employ the apparatus described herein.

Preferably, for wafer testing, at least the major surfaces of plates 12 and 14 are plated with gold in order to ensure good contact between plates 12 and 14 and between first plate 12 and a wafer to be tested. The two plates may be any diameter sufficient to support the article to be treated. Typically, for a wafer the apparatus 10 is about 3 inches high (8 cm) with first plate 12 being about one-half inch thick (1 cm) and 3⅜ inches (9 cm) in diameter. Second plate 14 is typically 1¾ inches (5 cm) high and 3 inches (8 cm) in diameter.

First plate 12 is supported by parallel posts or rails 18, 20 and 22 extending from a base 16. Typically, there are three such rails, each being about 2⅜ inches (6 cm) high and one-quarter inch (6 mm) in diameter.

First plate or chuck 12 has a flat thermally conductive upper surface 24 for holding a wafer or other relatively flat disk securely. A circular groove 26, about 3 inches (8 cm) in diameter, is cut or etched into upper surface 24 to a depth of about 15 mil (380 microns). A hole 28 in groove 26 connects groove 26 with a vacuum line 30. Vacuum line 30 creates a negative pressure zone under the wafer for clamping the wafer to the upper surface 24. Groove 26 on surface 24 of the plate 12 distributes the vacuum underneath the wafer making the pressure on the wafer against the plate 12 more uniform. Groove 26 need not be circular but may be any shape that uniformly distributes the vacuum underneath the wafer. Also, more than one groove may be provided, which may or may not be interconnected.

An electrical connection 32 leads into first plate 12 for supplying power for one or more heating elements and thermocouple. Typical power requirements for heating first plate 12 are 750 watts at 120 volts A.C.

A coolant inlet line 34 and a coolant outlet line 36 are connected to second plate 14 for providing coolant flow through second plate 14. Cooling is accomplished by passing the coolant through second plate 14 and by moving second plate 14 into thermal communication with first plate 12. Typically, ordinary tap water is used as the coolant. Alternatively, air or other liquids or gases may be used. Temperatures below room temperature can be achieved by passing chilled liquids or gases through second plate 14.

Vacuum line 38 connects to second plate 14 for retracting second plate 14 from thermal contact with first plate 12. When vacuum is not applied, a spring presses the plates 12 and 14 together. A vacuum line 40 also connects to second plate 14 clamping together first and second plates 12 and 14. A negative pressure zone, typically about 14 pounds per square inch, created by vacuum line 40 between first and second plates 12 and 14 generates a large force to force an intimate contact between the two plates for high heat transfer. The large contact force is typically around 135 pounds.

With reference to FIG. 2, during a heating phase, heating elements 42 in first plate 12 heat the upper surface 24 and any wafer 25 secured to surface 24 by vacuum line 30 and groove 26. Typically, heating elements 42 are one or more concentric, coiled or linear cable heaters well known in the art, and heat plate 12 from 25° C. to 300° C. in about 75 seconds. The temperature over the upper surface 24 of plate 12 is generally within 5° C. of the average temperature when plate 12 is at 300° C., the average temperature generally being maintainable within one or two degrees Celsius of the desired temperature for many days. Block 12 may be heated in an uncontrolled manner by applying electrical current to the heating elements until the desired temperature is reached and then shutting off the current until the temperature drops below the desired temperature. Alternatively, time proportioning circuitry may be used to regulate the current to prevent temperature overshoot and fluctuation.

Second plate or block 14 has an annular coolant chamber 44 through which coolant flows. Coolant enters the chamber through an inlet line connection hole 48 and exits through an outlet line connection hole 46. Connection holes 46 and 48 receive the coolant lines 34 and 36 seen in FIG. 1. A cooling cover 50 bolts to the bottom of second plate 14 to contain fluid in chamber 44 and may be unbolted in order to inspect or clean residue from chamber 44. Fluid seals 51, between block 14 and cooling cover 50, keep coolant from leaking. Typically, annular coolant chamber 44 has an inside wall diameter of about one inch (2.5 cm), an outside wall diameter of about 2¼ inches (6 cm), and a length of about 1⅛ inches (3 cm). Typical coolant flow rates for 15° C. to 20° C. tap water range from 40 to 80 cu. in /min (650–1100 ml/min) and result in a cooling time for a 300° C. to 25° C. drop of about 100 seconds. Other coolants and coolants with other coolant temperatures may flow at different rates and have different cooling times.

A shaft 52 extends outwardly from base 16 into an axial tubular chamber 56 in second plate 14. Shaft 52 and tubular space have the same diameter, generally about ⅛ inch (0.5 cm) in diameter, and second plate 14 is movable vertically on shaft 52. Second plate 14 is supported spaced above base 16 by a compression spring 54 between plate 14 and base 16. Spring 54 generally fits around shaft 52, and during a cooling phase, presses upper surface 64 of plate 14 against lower surface 62 of plate 12. Passageway 55 leads from vacuum line 38 to chamber 56 and is typically ⅛ inch (3 mm) diameter. Shaft 52 does not extend all of the way into chamber 56, but rather leaves at least a ⅛ inch (3 cm) space for motion. During a heating phase, chamber 56 is evacuated from line 38, and passageway 55, and spring 54 is compressed relieving any contact between surfaces 64 and 62.

Vacuum line 40 connects to plate 14 in a narrow tubular L-shaped passageway 60. Passageway 60 leads from vacuum line 40 to a thermally conductive top major surface 64 of plate 14. An elastomeric V-shaped annular seal 58 is seated around the upper rim surface 59 of plate 14, a portion of seal 58 projecting above the level of top major surface 64. Preferably, rim 59 and seal 58 is inset into plate 14 as shown in FIG. 2, but seal 58 may also merely wrap around the top edge of a cylindrical plate 14. When plate 14 is forced upward by spring 54 into contact with plate 12, a negative pressure zone is created between the top major surface 64 of plate 14 and the lower thermally conductive surface 62 of plate 12, by vacuum suction through passageway 60 and vacuum line 40. Seal 58 insures that the vacuum is maintained. As long as vacuum line 40 and fluid pressure line 38 are operating, first and second plates 12 and 14 remain in thermal communication for wafer cooling.

In FIG. 3, the apparatus 10 is shown in a cooling phase. First plate or chuck 12 secures a wafer 25. Heating elements 42 are turned off. Spring 54 maintains second plate 14 in thermal communication with plate 12. Vacuum suction through vacuum line 40 and passageway 60 creates a negative pressure zone between top major surface 64 of plate 14 and lower surface 62 of plate 12 and thereby forces high pressure contact of the two surfaces 62 and 64. Seal 58, pressed against surface 62 insures that the vacuum is maintained. Coolant flows through chamber 44. Cooling is greatly speeded by the fact that block 14 is a large heat sink at low temperatures that is brought into high force contact with plate 12 by the applied vacuum. Most of the wafer temperature reduction is accomplished by the stored heat capacity in block 14 and the water or other coolant in it.

In order to initiate a new heating phase, fluid leaves chamber 56 through passageway 55 and fluid line 38. Vacuum suction from line 40 is removed as air is allowed into passageway 60, thereby causing plate 14 to be separated from plate 12, as seen in FIG. 2. Heating elements 42 may then be turned on to heat the same or a different wafer 25.

In FIG. 4, the temperatures of the plate 12 and block 14 during operation of the apparatus 10 are shown beginning at the time 66 when the heating power is first turned on. During the heating phase, the plate temperature 68, i.e. the temperature of first plate 12, quickly rises from room temperature 70, approximately 25° C., to a preset maximum temperature 72. Typically, plate temperature 68 rises from 25° C. to 300° C. in approximately 75 seconds. During this heating phase, block 14 is in the lowered position shown in FIG. 2. The block temperature 74 remains steady at the water line temperature 76, i.e. the temperature of the coolant flowing through chamber 44 in block 14.

The plate temperature 75 remains at maximum temperature 72 within about 5° C. for a preset period of time 77, which may be up to several days. At a shutoff time 78 at the end of the preset heated period 77, the heating power is switched off and block 14 is raised into the position shown in FIG. 3. The plate temperature 80 falls rapidly back to room temperature 70 as block 14 soaks up heat from plate 12. Typically, plate temperature 80 falls from 300° C. to 25° C. in approximately 100 seconds. The temperature 82 of block 14 increases to a maximum temperature 84 as it soaks up heat. The large thermal mass of block 14 helps to keep maximum block temperature 84 well below the boiling point 86 of the coolant. Coolant flows through block 14 removing the heat soaked up from plate 12. After reaching maximum temperature 84, the block temperature 82 decreases to water line temperature 76.

The apparatus 10 has the advantage that coolant is thermally separated from the first plate or chuck 12 during the heating phase, and in contact with first plate 12 during the cooling phase. Thus, heating and cooling are more rapid. The apparatus 10 can be used for most wafer testing applications where heating and cooling of test wafers is desired.

We claim:

1. Apparatus for heating and cooling an article comprising,
    a first thermally conductive plate having opposed first and second major thermally conductive surfaces, the first surface having first clamping means for securely holding an article in tight contact therewith, the first plate having heating means disposed in thermal communication with said first surface for heating said first surface,
    a second thermally conductive plate having a major thermally conductive surface, the second plate having cooling means disposed in thermal communication with said major surface for removing heat from said first plate, the second plate mounted in at least partially spaced relation from the first plate, and
    second clamping means for removable urging the major thermally conductive surface of the second plate to contact the thermally conductive second surface of the first plate thereby establishing thermal communication between the first and second plates.

2. The apparatus of claim 1 further comprising a base supporting one of said first and second conductive plates, the other of said plates spaced from the one.

3. The apparatus of claim 2 wherein parallel posts extend outwardly from the base, the outward ends of said posts supporting one of said plates, the other of said plates having minor regions connected to the one plate.

4. The apparatus of claim 2 further comprising a shaft extending outward from said base, the shaft supporting the other of said plates spaced above said base and movable into contact with the one plate.

5. The apparatus of claim 1 wherein said first and second clamping means comprise negative pressure zones.

6. The apparatus of claim 5 wherein said second clamping means comprises an elastomer annular seal.

7. Apparatus for heating and cooling an article comprising,
    a thermally conductive plate having opposed upper and lower major thermally conductive surfaces, the upper surface having a groove therein in communication with vacuum suction means for securely holding an article in tight contact with the upper surface, the plate having heating means disposed in thermal communication with said upper surface for heating said upper surface,
    a thermally conductive block having a major thermally conductive surface, the block having heat removal means disposed in thermal communication with said major surface for cooling said first plate,
    a base,
    parallel rails extending outwardly form the base, the outward ends of said rails supporting the thermally conductive plate,
    a spring urging and supporting the block spaced above said base in thermal contact with said plate,
    a shaft extending outwardly from the base into an axial tubular chamber of said thermally conductive block, said block in at least partially spaced relation from the plate, said chamber in communication with vacuum means for forcing said second plate to retract from contact with said plate, and
    second clamping means for removable securing the major thermally conductive surface of the block in contact with the lower major thermally conductive surface of the plate thereby establishing thermal communication between the plate and block.

8. The apparatus of claim 7 wherein said second clamping means comprises
    an elastomer annular seal disposed around an upper rim of said block, a portion of said seal projecting above said major surface of said block, and
    vacuum suction means communicating with said major surface of the block for securely holding said major surface and said lower surface of the plate in thermally conductive relation.

* * * * *